(12) United States Patent
Bangert

(10) Patent No.: US 7,042,789 B2
(45) Date of Patent: May 9, 2006

(54) ENERGY STORING MEMORY CIRCUIT

(75) Inventor: Joachim Bangert, Erlangen (DE)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 10/493,400

(22) PCT Filed: Oct. 9, 2002

(86) PCT No.: PCT/DE02/03812

§ 371 (c)(1),
(2), (4) Date: Dec. 6, 2004

(87) PCT Pub. No.: WO03/038829

PCT Pub. Date: May 8, 2003

(65) Prior Publication Data

US 2005/0105368 A1    May 19, 2005

(30) Foreign Application Priority Data

Oct. 23, 2001   (DE)   ................................ 101 52 034

(51) Int. Cl.
*G11C 7/00* (2006.01)
(52) U.S. Cl. ................................ 365/227; 365/230.02
(58) Field of Classification Search ................ 365/227, 365/230.02
See application file for complete search history.

(56) References Cited

U.S. PATENT DOCUMENTS

| | | | | |
|---|---|---|---|---|
| 4,404,502 A | | 9/1983 | Magori et al. ............... 318/116 |
| 4,498,022 A | * | 2/1985 | Koyama et al. ............... 326/56 |
| 5,815,453 A | * | 9/1998 | Matsui ........................ 365/210 |
| 5,986,925 A | | 11/1999 | Naji et al. .................... 365/158 |
| 5,991,207 A | * | 11/1999 | Sedlak et al. ........... 365/189.01 |
| 6,256,224 B1 | | 7/2001 | Perner et al. ................ 365/173 |
| 6,265,846 B1 | | 7/2001 | Flechsig et al. ............. 320/116 |
| 6,563,743 B1 | * | 5/2003 | Hanzawa et al. ...... 365/189.02 |
| 6,891,753 B1 | * | 5/2005 | Cernea .................. 365/185.12 |

OTHER PUBLICATIONS

"Resonant Power Supply for Hot-Clock Reversible Low Power Computing" IBM Technical Disclosure Bulletin, IBM Corp. New York, US, vol. 37, No. 7, Jul. 1, 1994 pp. 147-150, XP000455468 ISSN: 0018-8689 the whole document.
Copy of German Office Action Dated Jul. 10, 2002.

\* cited by examiner

*Primary Examiner*—Michael Tran
(74) *Attorney, Agent, or Firm*—Slatter & Matsil, L.L.P.

(57) ABSTRACT

The invention relates to a memory arrangement having an energy storage device (store) which collects the energy transported during the flowing of a write or read current and makes it available for a new write or read operation.

20 Claims, 1 Drawing Sheet

ENERGY STORING MEMORY CIRCUIT

FIELD OF THE INVENTION

The present invention relates generally to memory devices. In particular, the present invention relates to a random access memory architecture.

BACKGROUND

Information is written to memory cells, in particular MRAM memory cells, by electric currents which flow from a constant-current source with respect to a fixed potential, such as, in particular, ground. Depending on their direction, these currents bring about a parallel or antiparallel orientation of the polarization of magnetoresistive layers that are separated by a tunnelling barrier layer within an individual memory cell of the MRAM array. As is known, a parallel orientation of the polarization is assigned a lower resistance than an antiparallel orientation of the polarization. Pulses are used for write currents, the pulse amplitude rather than the pulse duration being critical for the write operation.

During a write operation to a selected memory cell at the crossover between a specific word line and a specific bit line, in addition to magnetic energy, electrical energy is also converted into thermal energy, and thus consumed, as a result of the voltage drop across the line resistances of the word line or bit line. Overall, the energy balance (or "efficiency") is extremely unfavourable since a large part of the electrical energy is transformed into heat.

In addition to this energy loss, measures have to be taken so that the voltage drop across individual memory cells of memory cell arrays of varying sizes is kept uniform.

Moreover, when reading from a memory cell, a current pulse specifying the stored information flows, wherein the current pulse has a larger amplitude in the case of a lower resistance (parallel orientation of the polarization) than in the case of a higher resistance (antiparallel orientation of the polarization) and can thus represent a cell content as "1" or "0". In a similar manner to a write current, such a current pulse brings about an energy loss in the form of heat.

Hereinafter, the writing to and reading from a memory cell in a memory cell array of the memory arrangement will also be referred to as "addressing" or "setting".

As described below previous attempts at addressing this energy loss problem have not yielded promising results.

As is known, the interconnect resistance of a word line, bit line, or additional write line is determined by the specific conductivity of the interconnect material, the interconnect cross-sectional area and length. To avoid excessively large voltage drops across memory cells in a memory arrangement (also hereinafter referred to as a "memory circuit") and thus to reduce the risk of electrical breakdowns, the interconnects are designed with the least possible resistance, and the residual voltage remaining after setting is "consumed" in resistors connected downstream. In other words, losses in the interconnects and, in particular, in the resistors connected downstream are thus deliberately accepted. This means, however, that the energy balance is highly unfavourable in the case of such existing memory arrangements.

SUMMARY

Embodiments of the present invention provide a memory circuit in which energy losses are minimized, so that an improved energy balance is obtained.

In an exemplary embodiment, a memory circuit having at least one memory cell array containing a plurality of memory cells connected to bit lines and word lines and, if appropriate, additional write lines, contains at least one generator device. The generator device is designed as an energy storage system that collects the energy liberated during a setting operation (in particular a write operation) of at least one memory cell, so that the energy is not "consumed" in a resistor, but rather is available for subsequent write or read operations.

In a preferred embodiment, an MRAM memory array is connected to a generator device designed as an energy storage system which, when a memory cell is addressed (or set), collects the energy transported by the current flowing in the addressing process, so that the energy is available for subsequent addressing of memory cells.

DETAILED DESCRIPTION OF THE PREFERRED EMBODIMENTS

Figure 1:
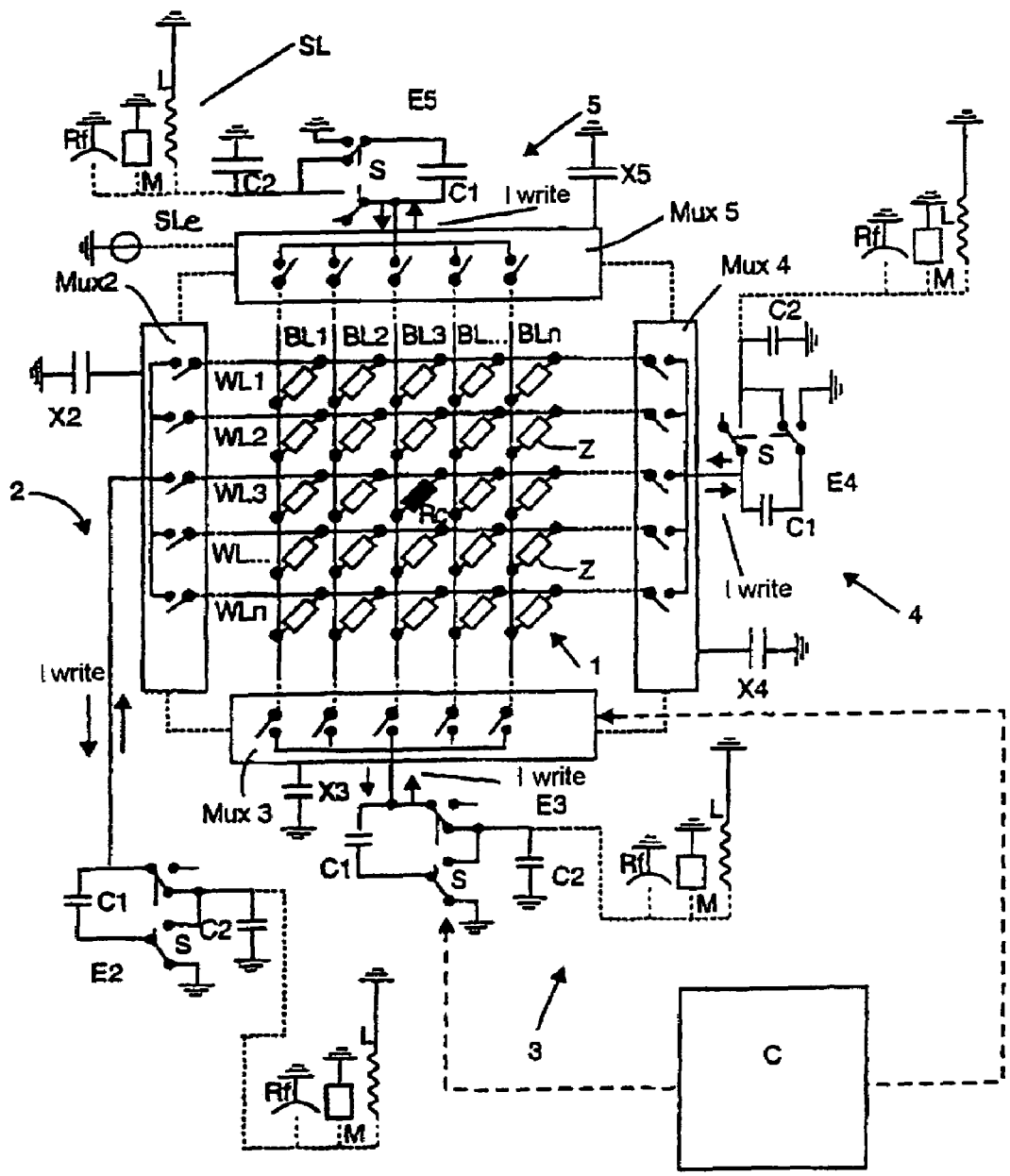
FIG. 1 illustrates a memory circuit comprising a multiplicity of MRAM memory cells arranged according to an exemplary embodiment of the present invention.

The following list of symbols is used consistently throughout the text and drawings.

| List of reference symbols | |
|---|---|
| 1 | Memory cell array |
| 2–5 | Generator devices |
| Mux2–Mux5 | Multiplexers |
| E2–E5 | Energy storage units |
| S | Switch pair |
| C1, C2 | Capacitors |
| M | Memory for spins |
| Rf | Reflector for spin waves |
| C | Central control unit |
| L | Inductance |
| SLe | Voltage-carrying line |
| WL1–WLm | Word lines |
| BL1–BLn | Bit lines |
| x2–x5 | Compensation energy stores |
| Iwrite | Write current |

FIG. 1 illustrates a memory circuit arranged according to an exemplary embodiment of the present invention. In this case, the individual memory cells or resistors Rc comprise so-called MTJ (MTJ=magnetic tunnel junction) layer sequences in which a tunnel layer is located between two magnetoresistive layers.

In circuit 100, each individual resistor (Rc) 102 lies between a word line (WL) 104 and a bit line (BL) 106. A total of m word lines 104 and n bit lines 106 are provided in the memory cell array 1. A selected cell 110, represented by a black filled-in resistor Rc, lies for example between word line 104, designated as WL3, and the bit line 106, designated as BL3. Cell 110 is selected by a specific voltage difference being applied to word line WL3 and bit line BL3.

A generator device in the form of an energy storage system 2, 3, 4, 5 is provided on each side of memory cell array 1. These energy storage systems 2, 3, 4, 5 each comprise an energy storage unit 112 (E2), 113 (E3), 114 (E4) and 115 (E5), respectively, and a multiplexer 122 (Mux2), 123 (Mux3), 124 (Mux4) and 125 (Mux5). Energy storage system 2, for example, comprises energy storage unit 112 and the multiplexer 122.

Each energy storage unit 112–115 comprises capacitors 131 (C1), 132 (C2), which can be converted from a series circuit into a parallel circuit by means of a switch pair 134 (S). In this case, the energy storage unit 112 has a parallel circuit of capacitors 131 and 132, while energy storage unit 114, which is connected to energy storage unit 112 via word lines 104, has a series circuit comprising corresponding capacitors 131, 132. Correspondingly, capacitors 131, 132 of energy storage unit 113 are configured, by means of the switch pair 134, in a parallel circuit and the capacitors 131, 132 of energy storage unit 115, which is connected to the energy storage unit 114 via bit lines 106, are configured in a series circuit. In other words, word lines 104 and the bit lines 106 are each provided with an energy storage unit in each case at their mutually opposite ends, with capacitors connected in a series circuit at one end and capacitors connected in a parallel circuit at the opposite end. The switches 134, which preferably comprise transistors, such as, in particular, MOS transistors, can be driven by a central control unit 140 (C), as is indicated diagrammatically for switch pair 134 of energy storage unit 113.

The series and parallel circuits of capacitors 131 and 132 are put at fixed potential, for example ground, at the end not connected to the respective multiplexers.

Instead of capacitors, energy storage units 112–115 may also have other energy stores, such as, for example, memories 160 (M) for spins and reflectors 170 (Rf) for spin waves or inductances 180 (L). However, energy storage units constructed from capacitors are preferably used. It is also possible for there to be more than two capacitors in each case in a parallel circuit or a series circuit.

Multiplexers 122, 123, 124, 125 may also be provided in each case with a compensation energy store 142 (x2), 143 (x3), 144(x4) and 145 (x5), which can compensate for energy losses that possibly occur and can be connected in by the corresponding multiplexer, under the control of the control unit 140. Instead of such a compensation energy store, it is also possible, if appropriate, to provide a voltage-carrying line 150 (SL), as is shown by way of example for the multiplexer 125.

As is known, information is written to MRAM memory cells 102, for example, by means of electric currents. In such case, currents usually flow from a constant-current source with respect to ground, causing resistance losses so that the energy balance is unfavourable overall.

In exemplary embodiments of the present invention, the interconnects of word lines 104 and bit lines 106 are composed of a material with the least possible bulk resistance, so that inherently comparatively little electrical energy is converted into heat.

Preferably, the flowing electrical energy which is output, for example, from energy storage unit 115 and from the energy storage unit 114 is not "consumed" in resistors, but rather can be stored in the energy storage units 113 and 112, respectively. In other words, energy storage units 114 and 115 using the series circuits of capacitors 131, 132, act as a source of a write current ($I_{write}$) which flows from energy storage units 114, 115 into energy storage units 112 and 113, respectively, and is taken up and stored there by capacitors 131, 132 which are connected in a parallel circuit.

The sources of electrical charges formed by the series circuits of capacitors which are discharged via the interconnects of word lines 104 or bit lines 106 into corresponding energy storage units comprising parallel circuits of corresponding capacitors. The transport of charges is linked with a magnetic field with which the MRAM memory cells can be switched in a known manner. In the exemplary embodiment of the present invention illustrated in FIG. 1, word line WL3 and bit line BL3 are driven via the multiplexer pairs 122, 124 and 123, 125, respectively, so that a corresponding write current flows through these lines to the memory cell 110.

Multiplexers 112–115 can in each case be changed over by the central control unit 140 in a clock- and pulse-controlled manner, so that, overall, the number of sources and sinks of charges that is required is no more than the number of constant-voltage sources and series resistors that has been required heretofore in existing memory arrangements.

The series circuit of the capacitors 131, 132 is to be regarded as a charge source since it has double the voltage of the individual capacitors at its output, while a parallel circuit of these capacitors supplies only a single voltage. Thus, if the two circuits, that is to say a series circuit and a parallel circuit, are linked with one another at opposite ends of the word lines or bit lines, then a charge equalization current flows from the series circuit into the parallel circuit. A switch pair or other suitable device can convert the series circuit to a parallel circuit, so that a source becomes a sink, and vice versa. Charge equalization thus takes place in the respective opposite direction.

If appropriate, the multiplexers 122–125 may also be configured and interconnected in such a way that currents flow through the interconnects of the word lines and bit lines always in the same direction.

The compensation energy store in the form of the additional capacitors 142–145 is provided in order to compensate, after writing, for energy losses on account of the magnetic field and the interconnect resistance in the case of the respective parallel circuit. In other words, if, for example, a write current $I_{write}$ flows from the energy storage unit 115 to the energy storage unit 113, then the loss occurring in the process is compensated for by the additional capacitor 143. Instead of such an additional capacitor, the voltage-carrying line 152 (Sle) can also be used, if appropriate.

In the above exemplary embodiment, the energy storage units comprise capacitors. In other embodiments of the present invention, other suitable energy stores can also be used for this purpose, as indicated diagrammatically in FIG. 1, for example, by spin memory 160, spin reflector 170 and coil 180.

Memory circuit 100 is preferably employed an MRAM circuit. However, in other embodiments of the present invention, memory circuit 100 can also be used in other types of memory.

Moreover, in embodiments of the present invention, it is not necessary for an energy storage unit with a multiplexer to be provided at each side of a memory cell array. Rather, it is also possible to equip, for example, only word lines 104 or only bit lines 106 with corresponding energy storage units and multiplexers.

The multiplexers themselves are preferably configured in such a way that they allow the driving of a word line or bit line associated with a selected memory cell, so that the $I_{write}$ flows only through the respective corresponding word line or bit line. The same applies correspondingly to a read operation.

Accordingly, embodiments of the present invention comprise a memory circuit constructed with generator devices for storing energy used in memory operations, thereby minimizing energy loss and improving the energy balance. The generator device may comprise four generator units, each of which is located at one side of the memory cell array and is connected to the word lines or bit lines via multiplexers.

In exemplary embodiments of the present invention, the generator units may be able to be changed over in a clock- or pulse-controlled manner and thus serve as clock- or pulse-controlled charge sources. Transistors are preferably used for the clock- or pulse-controlled changeover.

The generator units each have energy storage units, for which any desired combinations of capacitors, inductances or other storage designs can be used. Such designs may be, in particular, novel energy stores such as memories for spins in semiconductors or reflectors for spin waves. Memories for spins exploit the fact that spins can be preserved for a very long time, and are regarded as promising magnetoelectronic components. The use of capacitors in energy storage units is particularly advantageous, however, since they can readily be integrated and realized in a simple manner.

If capacitors are used in the energy storage units, the capacitors may be changed over from a parallel circuit of at least two capacitors into a series circuit of said two capacitors by clock- or pulse-controlled changeover of at least one switch pair. By way of example, if a series circuit of two capacitors is located at one end of a bit line and a parallel circuit of two corresponding capacitors is located at the other end of the same bit line, then a write current flows from one end of the bit line to the other end of the bit line via the respective selection transistors. If the series circuit at the one end of the bit line is then changed over into a parallel circuit of the two capacitors and if the parallel circuit of the two capacitors at the other end of the bit line is switched to a series circuit of these two capacitors, then the arrangement is ready to generate a current pulse again.

Additional compensation energy stores may also be provided, which are constructed in a similar manner to the energy storage units and can compensate for energy losses arising after a setting operation of at least one memory cell. These additional compensation energy stores can be connected to word lines or bit lines via the respective multiplexers, so that it is possible to compensate for energy losses that occur, if appropriate, by connecting in these compensation energy stores.

Like the energy storage units, the compensation energy stores likewise preferably comprise capacitors.

The foregoing disclosure of the preferred embodiments of the present invention has been presented for purposes of illustration and description. It is not intended to be exhaustive or to limit the invention to the precise forms disclosed. Many variations and modifications of the embodiments described herein will be apparent to one of ordinary skill in the art in light of the above disclosure. The scope of the invention is to be defined only by the claims appended hereto, and by their equivalents.

Further, in describing representative embodiments of the present invention, the specification may have presented the method and/or process of the present invention as a particular sequence of steps. However, to the extent that the method or process does not rely on the particular order of steps set forth herein, the method or process should not be limited to the particular sequence of steps described. As one of ordinary skill in the art would appreciate, other sequences of steps may be possible. Therefore, the particular order of the steps set forth in the specification should not be construed as limitations on the claims. In addition, the claims directed to the method and/or process of the present invention should not be limited to the performance of their steps in the order written, and one skilled in the art can readily appreciate that the sequences may be varied and still remain within the spirit and scope of the present invention.

What is claimed is:

1. A memory circuit for reduced energy loss comprising:
   a memory cell array containing a plurality of memory cells, each memory cell connected to a word line and bit line; and
   at least one generator device configured to feed a current into a bit line and/or wordline assigned to a memory cell during reading or writing the memory cell, wherein the generator device comprises an energy storage system that collects the energy transported by the current flowing during an addressing process, so that the energy is available for subsequent addressing of memory cells, and wherein the energy storage system is configured to change over between an energy take-up state and an energy release state in a clock-controlled manner.

2. The memory circuit of claim 1, wherein the energy storage system is connected to the memory cell array via multiplexers.

3. The memory circuit of claim 1, further comprising:
   at least one compensation energy store or voltage-carrying line, whereby energy losses arising before, during and after writing to or reading from a memory cell are compensated.

4. The memory circuit of claim 3, wherein the compensation energy store is constructed from at least one capacitor and/or at least one inductor.

5. The memory circuit of claim 3, wherein the compensation energy store is constructed from at least one memory for spins in semiconductors and at least one reflector for spin waves.

6. The memory circuit of claim 1, wherein the memory cell ray comprises an MRAM array.

7. The memory circuit of claim 1, wherein the memory array comprises a DRAM array.

8. A memory circuit for reduced energy loss comprising:
   a memory cell array containing a plurality of memory cells, each memory cell connected to a word line and bit line; and
   at least one generator device configured to feed a current into a bit line and/or wordline assigned to a memory cell during reading or writing the memory cell, wherein the generator device comprises an energy storage system that collects the energy transported by the current flowing during an addressing process, so that the energy is available for subsequent addressing of memory cells, wherein the energy storage system comprises energy storage units arranged on opposite sides of the memory cell array.

9. The memory circuit of claim 8, wherein an energy storage unit is constructed from capacitors and/or inductors.

10. The memory circuit of claim 8, wherein the energy storage unit is constructed from memories for spins in semiconductors and reflectors for spin waves.

11. The memory circuit of claim 9, wherein the capacitors are connected to a switch device configured to change the arrangement of the capacitors to or from a parallel circuit of at least two capacitors into a series circuit thereof.

12. The memory circuit of claim 8, wherein the memory array comprises an MRAM array.

13. The memory circuit of claim 8, wherein the memory array comprises a DRAM array.

14. A memory architecture for reducing energy consumption in memory operation comprising:
- a memory array containing memory cells addressable by bit lines and wordlines;
- at least one pair of energy storage units for storing and delivering energy to the memory array that is used in addressing operations, wherein each energy storage unit of the pair lies on an opposite side of the memory array from the other storage unit; and
- a mutliplexer coupled to the energy units such that energy can be delivered to and from individual wordlines or bitlines used to address a memory cell, wherein each energy storage unit comprises at least two capacitors that be alternately arranged as a series capacitor circuit or as a parallel capacitor circuit by means of a switch.

15. The memory architecture of claim 14, further comprising a central control unit to control change over of multiplexers and to drive the switches in the storage units.

16. The memory architecture of claim 14, wherein energy traveling to and from the memory array is stored in storage units containing spin memories, spin wave reflectors, or inductors.

17. The memory architecture of claim 14, further comprising at least one compensation energy store, each store comprising a capacitor to compensate for energy losses due to a magnetic field or interconnect resistance.

18. The memory architecture of claim 14, wherein the memory array is an MRAM array.

19. The memory architecture of claim 14, wherein the memory array is a DRAM array.

20. The memory architecture of claim 14, wherein the wordline and bitline interconnects are comprised of material with a minimum bulk resistance.

* * * * *